(12) United States Patent
Fontanesi

(10) Patent No.: US 12,366,465 B2
(45) Date of Patent: Jul. 22, 2025

(54) SENSOR SYSTEM, SYSTEM AND METHOD FOR DETERMINING A POSITION OR A ROTATIONAL ANGLE

(71) Applicant: Infineon Technologies AG, Neubiberg (DE)

(72) Inventor: Simone Fontanesi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/495,973

(22) Filed: Oct. 7, 2021

(65) Prior Publication Data
US 2022/0113164 A1   Apr. 14, 2022

(30) Foreign Application Priority Data
Oct. 13, 2020 (DE) .......................... 102020126871.8

(51) Int. Cl.
*G01D 5/16* (2006.01)
(52) U.S. Cl.
CPC ...................... *G01D 5/16* (2013.01)
(58) Field of Classification Search
CPC .. G01D 5/12; G01D 5/14; G01D 5/16; G01D 5/244; G01D 5/245; G01D 5/2451; G01R 33/02; G01R 33/028; G01R 33/0283; G01R 33/06; G01R 33/09; G01R 33/091
See application file for complete search history.

(56) References Cited

U.S. PATENT DOCUMENTS

| | | | |
|---|---|---|---|
| 5,386,642 A | 2/1995 | Spies et al. | |
| 6,242,905 B1 | 6/2001 | Draxelmayr | |
| 6,622,391 B1 | 9/2003 | Shirai et al. | |
| 10,732,194 B2 | 8/2020 | Hainz et al. | |
| 2002/0171418 A1 | 11/2002 | Hinz et al. | |
| 2005/0258820 A1 | 11/2005 | Forster | |
| 2010/0072988 A1* | 3/2010 | Hammerschmidt | G01D 5/142 324/207.25 |
| 2010/0134095 A1* | 6/2010 | Loreit | G01D 5/147 324/207.2 |
| 2010/0327864 A1 | 12/2010 | Vigna et al. | |
| 2011/0031965 A1 | 2/2011 | Saruki et al. | |
| 2012/0095712 A1* | 4/2012 | Komasaki | G01D 5/145 702/94 |

(Continued)

FOREIGN PATENT DOCUMENTS

| | | |
|---|---|---|
| DE | 10020978 A1 | 11/2000 |
| DE | 102017106324 A1 | 9/2017 |

(Continued)

*Primary Examiner* — Huy Q Phan
*Assistant Examiner* — David B Frederiksen
(74) *Attorney, Agent, or Firm* — Harrity & Harrity, LLP

(57) ABSTRACT

A sensor system includes a first group of sensor elements sensitive to a magnetic field in a predetermined direction, wherein the first group of sensor elements supplies a first signal indicative of the magnetic field in the predetermined direction. Further, the sensor system includes a second group of sensor elements sensitive to the magnetic field in the predetermined direction, wherein the second group of sensor elements supplies a second signal having a relative phase shift relative to the first signal. A combination of the first signal and the second signal indicates a rotational angle of an object.

20 Claims, 8 Drawing Sheets

(56) References Cited

U.S. PATENT DOCUMENTS

| | | | | |
|---|---|---|---|---|
| 2013/0057259 A1* | 3/2013 | Burkhardt | ............ | G01D 5/2457 324/207.11 |
| 2013/0241544 A1* | 9/2013 | Zimmer | ................. | G01P 3/487 324/252 |
| 2013/0300402 A1* | 11/2013 | Liu | .................... | G01R 33/0035 324/252 |
| 2013/0334634 A1 | 12/2013 | Deak et al. | | |
| 2014/0197822 A1 | 7/2014 | Ritter et al. | | |
| 2015/0022186 A1* | 1/2015 | Ausserlechner | ......... | G01B 7/30 324/207.13 |
| 2015/0137797 A1* | 5/2015 | Ausserlechner | ......... | G01D 3/08 324/207.13 |
| 2017/0089940 A1* | 3/2017 | Bussan | .................. | G01P 13/02 |
| 2017/0219383 A1* | 8/2017 | Umehara | .............. | G01D 5/165 |
| 2017/0241803 A1* | 8/2017 | Ausserlechner | ....... | G01D 5/145 |
| 2017/0254672 A1* | 9/2017 | Voss | ....................... | G01D 5/145 |
| 2017/0314975 A1* | 11/2017 | Mochizuki | ............... | G01D 5/16 |
| 2018/0003522 A1* | 1/2018 | Ionescu | .................. | G01D 5/145 |
| 2018/0087888 A1* | 3/2018 | Ausserlechner | ....... | G01D 5/145 |
| 2018/0172481 A1* | 6/2018 | Mochizuki | ............. | G01D 5/145 |
| 2018/0231400 A1* | 8/2018 | Okumura | ............. | G01D 5/2454 |
| 2018/0283905 A1 | 10/2018 | Werth et al. | | |
| 2019/0234763 A1* | 8/2019 | Foletto | ................... | G01R 33/09 |
| 2019/0277874 A1* | 9/2019 | Hainz | ..................... | G01P 3/487 |
| 2019/0353773 A1 | 11/2019 | Hammerschmidt et al. | | |
| 2020/0400463 A1* | 12/2020 | Sogo | ....................... | G01D 5/16 |
| 2022/0048559 A1* | 2/2022 | Gorbold | ............. | G01D 5/24461 |

FOREIGN PATENT DOCUMENTS

| | | |
|---|---|---|
| DE | 102019104895 A1 | 9/2019 |
| EP | 0554518 B1 | 7/1996 |
| EP | 2546611 A1 | 1/2013 |
| JP | H08204252 A | 8/1996 |
| WO | 2011111494 A1 | 9/2011 |

\* cited by examiner

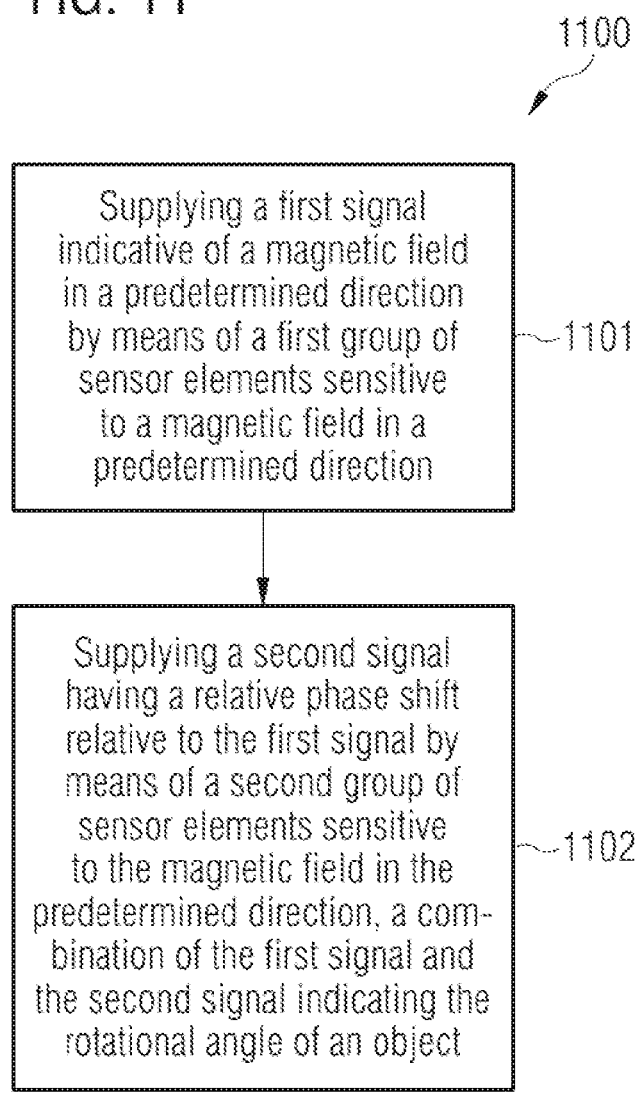

SENSOR SYSTEM, SYSTEM AND METHOD FOR DETERMINING A POSITION OR A ROTATIONAL ANGLE

RELATED APPLICATION

This application claims priority to German Patent Application No. 102020126871.8, filed on Oct. 13, 2020, which is incorporated herein by reference in its entirety.

FIELD

The present disclosure relates to a sensor system, a system, and a method for determining a position or a rotational angle.

BACKGROUND

Angular sensors are often used in automotive applications such as electric power steering (EPS) or anti-lock braking systems (ABS) to determine an angular position of a rotating shaft. The shaft is usually coupled to a magnet. By this means, the rotating shaft generates an alternating magnetic field. For proper determination of rotational angles, it is needed to arrange the angular sensor at the end of the shaft. By this means, the angular sensors can sense two magnetic field components each noticeable changing once the shaft is rotating.

There are some applications requiring an out-of-shaft arrangement of angular sensors. For example, it is preferred to place an angular sensor offset from the axis of the shaft to reduce the size of an automotive system or when the end of the shaft is not available for sensing. However, current solutions cannot provide a flexible arrangement if rotational angles are to be determined accurately.

For safety reasons, ABS systems or other angle sensing applications are to be improved in sensitivity. Limits are reached as present angular sensors may be restricted in their angular resolution.

Hence, there is still a demand for an improved system to determine a position or a rotational angle of an object.

SUMMARY

An embodiment of a sensor system comprises a first group of sensor elements sensitive to a magnetic field in a predetermined direction, wherein the first group of sensor elements supplies a first signal indicative of the magnetic field in the predetermined direction. Further, the sensor system comprises a second group of sensor elements sensitive to the magnetic field in the predetermined direction, wherein the second group of sensor elements supplies a second signal having a relative phase shift relative to the first signal, wherein a combination of the first signal and the second signal indicates a rotational angle of an object. The first and second group of sensors elements are sensitive to the same component of the magnetic field. As the sensor system measures the magnetic field in one dimension, e.g., rather than in two dimensions, the sensor elements can be arranged flexibly such that changes of the magnetic field component can be sensed appropriately. The first and the second signal indicating the same magnetic field component differ from each other in phase, e.g., depending on the position of the sensor elements of the first and second group. The phase difference between the two signals can be used to determine the rotational angle or position of the object.

BRIEF DESCRIPTION OF THE DRAWINGS

Some examples of apparatuses and/or methods will be described in the following by way of example only, and with reference to the accompanying figures, in which
FIG. 11 illustrates a flow chart for an embodiment of a method for determining a position or a rotational angle.

DETAILED DESCRIPTION

Figure 1:
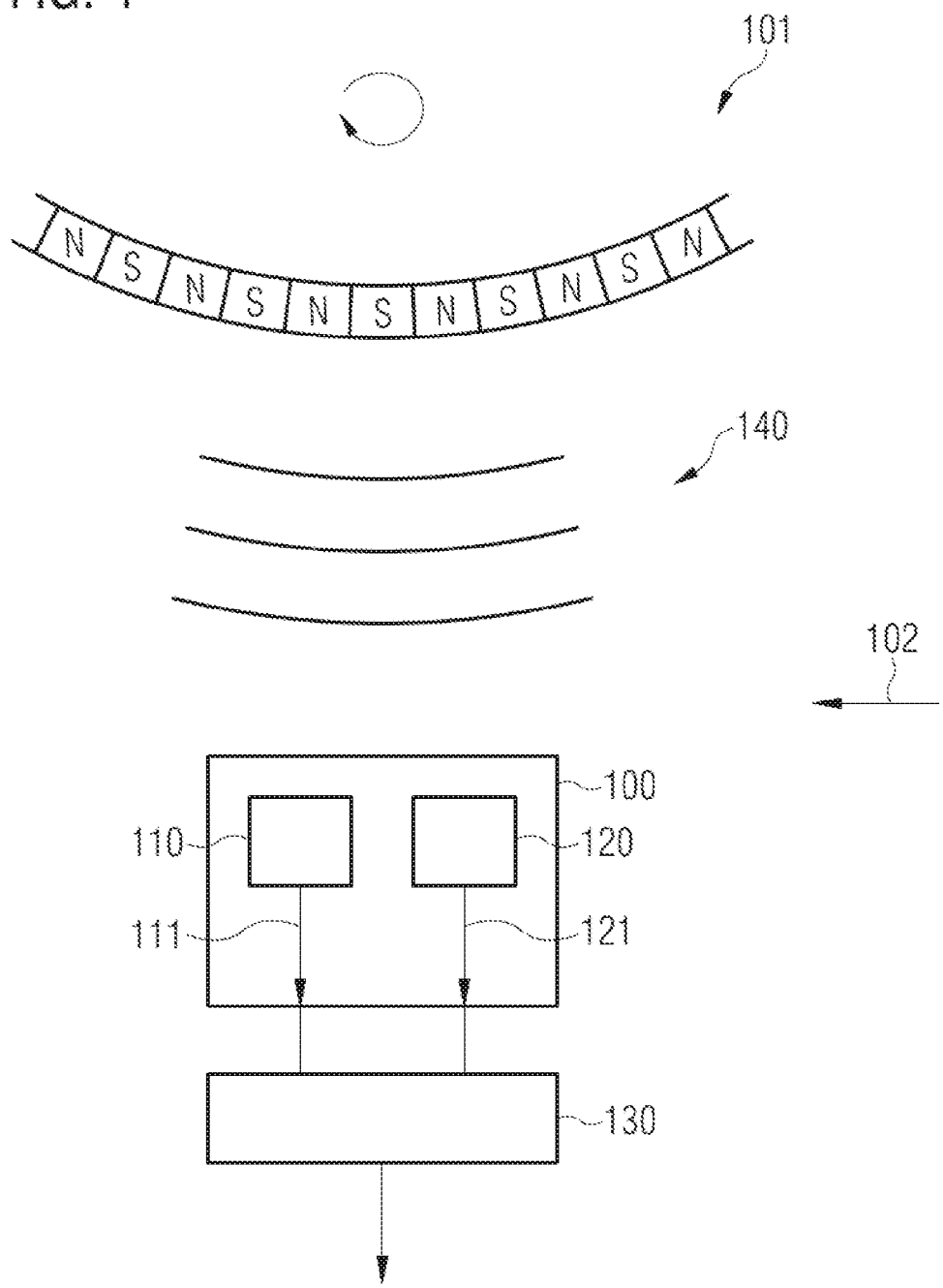
FIG. 1 illustrates an embodiment of a sensor system.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an embodiment of a sensor system 100 comprising a first group of sensor elements 110 and a second group of sensor elements 120 sensing a magnetic field 140 of an encoder 101. A rotation of the encoder 101 may generate an alternating magnetic field 140 sensible by the sensor system 100. In the given example, the sensor system 100 is further connected to an evaluation circuitry 130.

The first group of sensor elements 110 is sensitive to the magnetic field 140 in a predetermined direction exemplarily indicated by the arrow 102 shown in FIG. 1. The first group of sensor elements 110 supplies a first signal 111 indicative of the magnetic field 140 in the predetermined direction 102. Analogously, the second group of sensor elements 120 is sensitive to the magnetic field 140 in the predetermined direction 102. The second group of sensor elements 120 supplies a second signal 121 having a relative phase shift to the first signal 111. A combination of the first signal 111 and the second signal 121 indicates a rotational angle of the encoder 101 or an object connected to the encoder 101.

For example, the implementation in FIG. 1 can be considered in a cartesian coordinate system. The first group of sensor elements 110 are arranged such that a predetermined component of the magnetic field 140, e.g., along the x-axis can be sensed. The second group of sensor elements 120 are arranged such that they are also able to sense the same magnetic field component. A group of sensor elements may comprise one, two, three or more sensor elements.

As exemplarily illustrated in FIG. 1, the first and second group of sensor elements 110, 120 are arranged next to each other regarding the predetermined direction 102. Based on the displacement between the sensor elements of the first group 110 and the sensor elements of the second group 120, different magnetic field strengths regarding the predetermined direction 102 can be sensed. According to the sensed magnetic field 140, the sensor elements of the first group 110 and the second group 120 can be used to generate the first and second signal 111, 121, respectively. For example, the sensor elements of the first and second group 110, 120 can generate the first and second signal 111, 121 directly or the sensor elements can generate a temporary signal which can be further processed to generate or output the first and second signal 111, 121.

Figure 2:
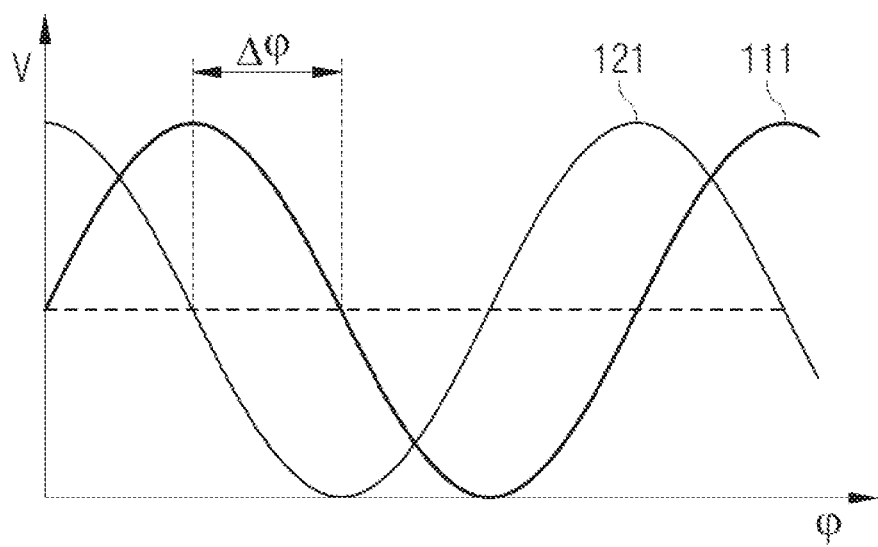
FIG. 2 illustrates an example for the first signal and the second signal.

FIG. 2 illustrates an example of the first signal 111 corresponding to a sine voltage signal and the second signal 121 corresponding to a cosine voltage signal with respect to the alternating magnetic field 140 due to a rotation of the encoder 101 in FIG. 1. The amplitudes of the signals 111, 121 are given in dependence on a phase. The sensors of the first group are arranged in such way that the first signal corresponds to a sine wave and the sensors of the second group are arranged in such way that the second signal corresponds to a cosine wave. As a result, the first signal has a phase shift $\Delta\varphi$ of 90° relative to the second signal if phases are considered in degrees. The phase shift between the first and second signal can be further used to conclude on an orientation of the encoder relative to the sensors by means of the evaluation circuitry 130.

Generally, the first and the second signal 111, 121 can be an analog signal or a high-resolution digital representation of the analog signal. The first and second signal 111, 121 can be of any type such as a triangle or square-wave signal if appropriate. The relative phase shift of the first signal and the second signal can less or higher than 90° such as 5°, 10°, 11°, 15°, 20°, 45° or more. Alternatively, the relative phase shift can be considered in radian units. If needed, the first and second signal 111, 121 can be further processed to generate or output signals comprising a relative phase shift of approximately 90°.

According to the example in FIG. 1, the evaluation circuitry 130 is configured to use the first signal 111 and the second signal 121 to determine a position or the rotational angle of the (object connected to the) encoder 101. For example, the evaluation circuitry 130 may calculate the rotational angle based on the amplitude of the first and second signal 111, 121 and the known phase shift between both signals. For example, the evaluation circuitry 130 may use a tangent relation based on the first and the second signal 111, 121 for determining the rotational angle. According to another example, the evaluation circuitry 130 may use calculations similar to those used in conventional angular sensors (e,g, via CORDIC algorithm) or any arbitrary calculation, operation or transformation to conclude on an rotational angle of an object.

The sensor system 100 may be also used to determine an orientation, a direction or change of motion, a speed, an acceleration, or position of an arbitrary object providing an alternating magnetic field.

As illustrated in FIG. 1, the evaluation circuitry 130 can be arranged externally from the sensor system 100. For example, the sensor system 100 is implemented on a first die and the evaluation circuitry 130 is implemented on a second die different from the first die. For determination of, e.g., rotational angles, the first die may be connected to the second die. A separate implementation may be beneficial, e.g., for easier manufacturing of the sensor system or as only one implementation is needed as the sensing or evaluating system is already available.

According to another example, the first and second group of sensor elements 110, 120 and the evaluation circuity 130 are implemented on a same die. Implementation on the same die may be beneficial to save costs due to less material consumption or to reduce the size of sensor system for determining rotational angles.

Figure 3:
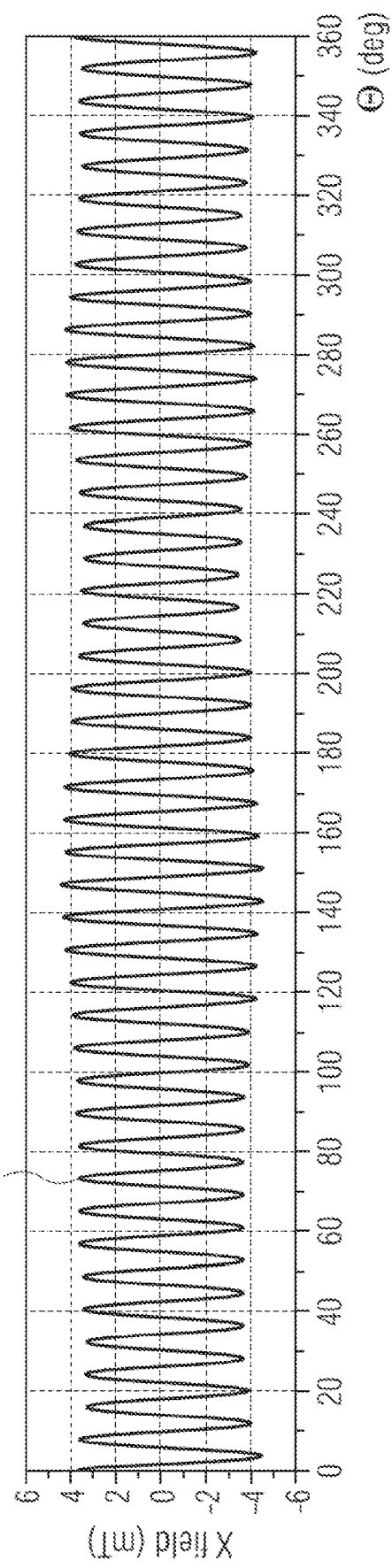
FIG. 3 illustrates a first example for an output protocol.
Figure 4:
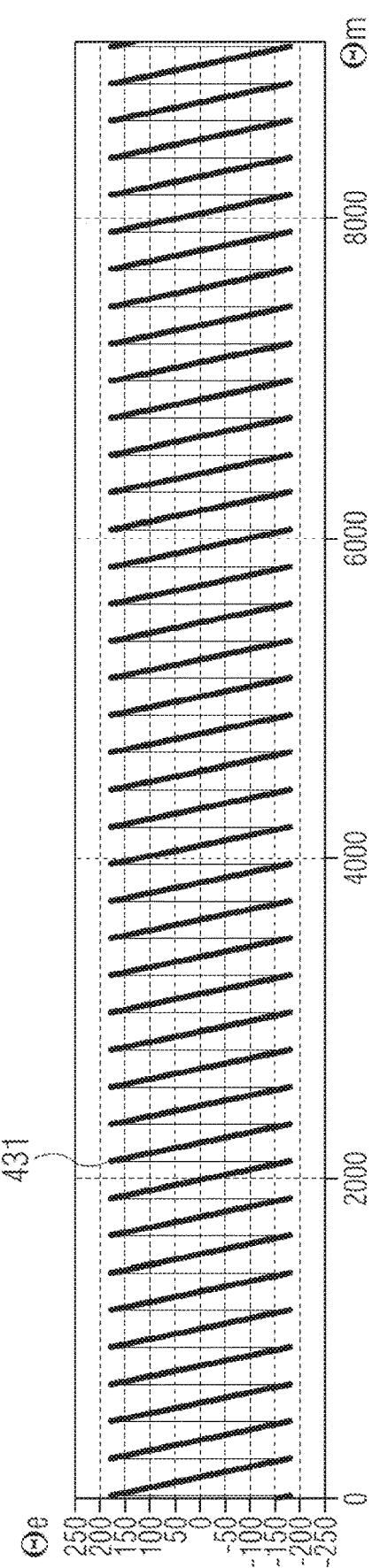
FIG. 4 illustrates a second example for an output protocol.

The evaluation circuitry 130 may be further configured to generate an output protocol indicating the rotational angle based on the first signal and the second signal. FIGS. 3 and 4 illustrates examples of output protocols 331, 431 each indicating the rotational angle from the $B_x$ readout based on a typical magnetic encoder wheel. Local maxima and minima may depend on a pitch between, e.g., magnetic or toothed segments of the encoder.

For example, the output protocol 331 indicates the angle of the encoder, e.g., between 0° to 360° (full rotation) by means of the sensor system 100 sensing the magnetic field, e.g., in x-direction. FIG. 4 shows an output protocol 431 based on electrical and mechanical degrees. According to other examples the output protocol may comprise other variables indicating an angular position of the encoder. The output protocol may comprise amplified signals or a (e.g. high-resolution) digital signal by sampling an analog output signal based on the first and second (analog) signal. Such analog/digital post-processing and digital protocol generation can be implemented directly in the integrated circuit (IC) of the sensor system 100 or the evaluation circuitry 130 connected to the sensor system 100. Digital protocols may refer to an A/B/Index, SPI or any other type of protocol, e.g., conventionally used for angular sensors.

In the following, some examples for sensor arrangements are illustrated referring to FIGS. 5-7. The examples are only given for a better understanding of a sensor system and may not be understood in a restrictive manner.

Figure 5:
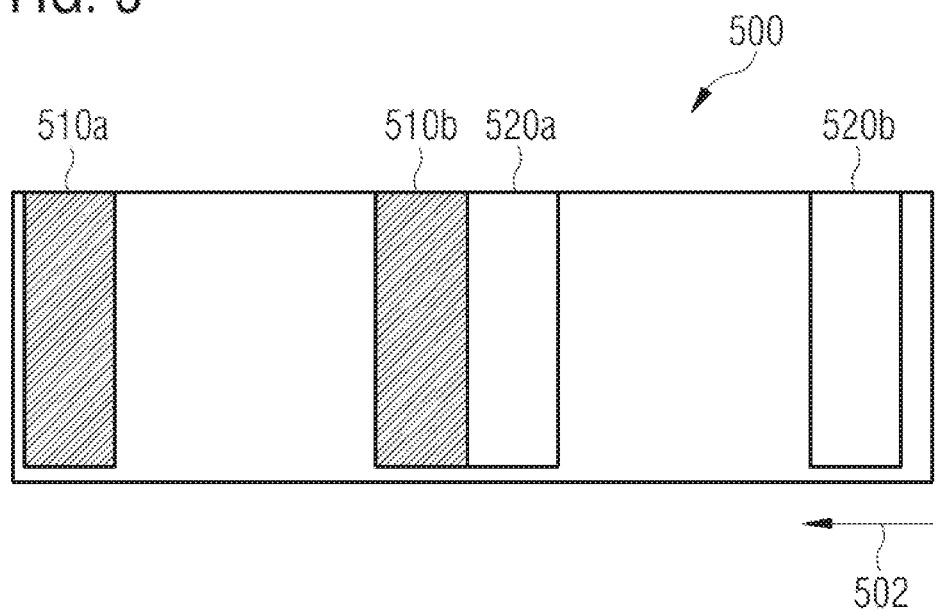
FIG. 5 illustrates a first example for arrangement of the first and second group of sensor elements.

FIG. 5 illustrates an embodiment of a sensor system, wherein the first group of sensor elements 510a-b is displaced from the second group of sensor elements 520a-b in the predetermined direction as indicated by the arrow 502. Additionally, and as illustrated, a first portion of sensor elements 510a and a second portion of sensor elements 510b of the first group 510a-b can be displaced from each other in the predetermined direction 502. Analogously, a first portion of sensor elements 520a and a second portion of sensor elements 520b of the second group 520a-b can be displaced from each other in the predetermined direction 502. The second portion of sensor elements 510b of the first group and the first portion of sensor elements 520a of the second group can be arranged directly next to each other.

Displacements between sensor elements can be different from the dimensions given in FIG. 5. Generally, displacements between sensor elements may refer to a characteristic of an object providing an alternating magnetic field. For example, the distance between the first portion of sensor elements 510a of the first group and the second portion of sensor elements 520b of the second group is based on a pitch of (e.g., magnetic or toothed) segments of an encoder. By means of a sensor disposition with respect to a segment characteristic, the sensor elements may be able to sense distinctive magnetic field strengths in the predetermined direction. Sensing at different positions under consideration of a characteristic of the magnetic field may enable to generate the first and second signal with a relative phase shift. As described above, the relative phase shift can be used to conclude on the (angular) position of the object.

Figure 6:
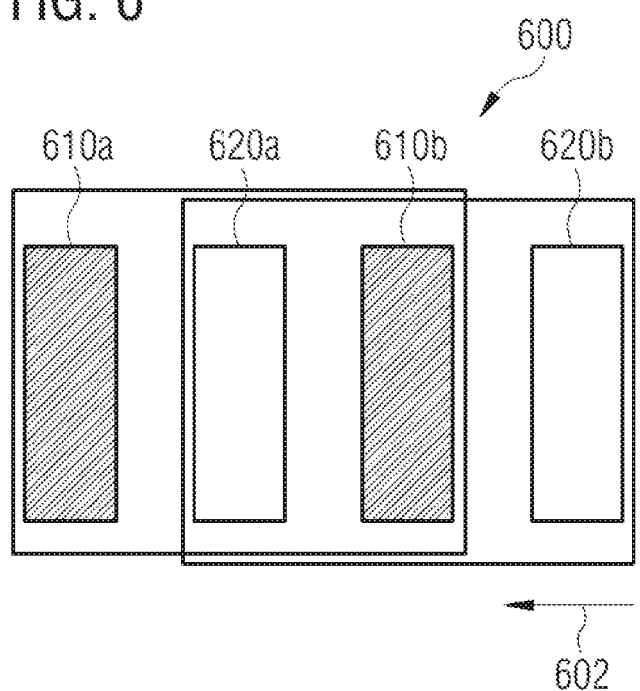
FIG. 6 illustrates a second example for arrangement of the first and second group of sensor elements.

FIG. 6 illustrates an embodiment of a sensor system 600, wherein a first portion 620a of the second group of sensor elements 620a-b is arranged between a first portion 610a and a second portion 610b of the first group of sensor elements 610a-b in a predetermined direction 602. Similarly, the second portion 610b of the first group of sensor elements 610a-b is arranged between a first portion 620a and a second portion 620b of the second group of sensor elements 620a-b in the predetermined direction 602. In contrast to FIG. 5, portions of different groups of sensors elements are arranged alternately. As exemplarily illustrated, the first portion of the second group of sensor elements 620a and the second portion of the first group of sensor elements 610b are not directly arranged next to each other. As illustrated, portions of sensor elements may comprise a same distance from each other.

Figure 7:
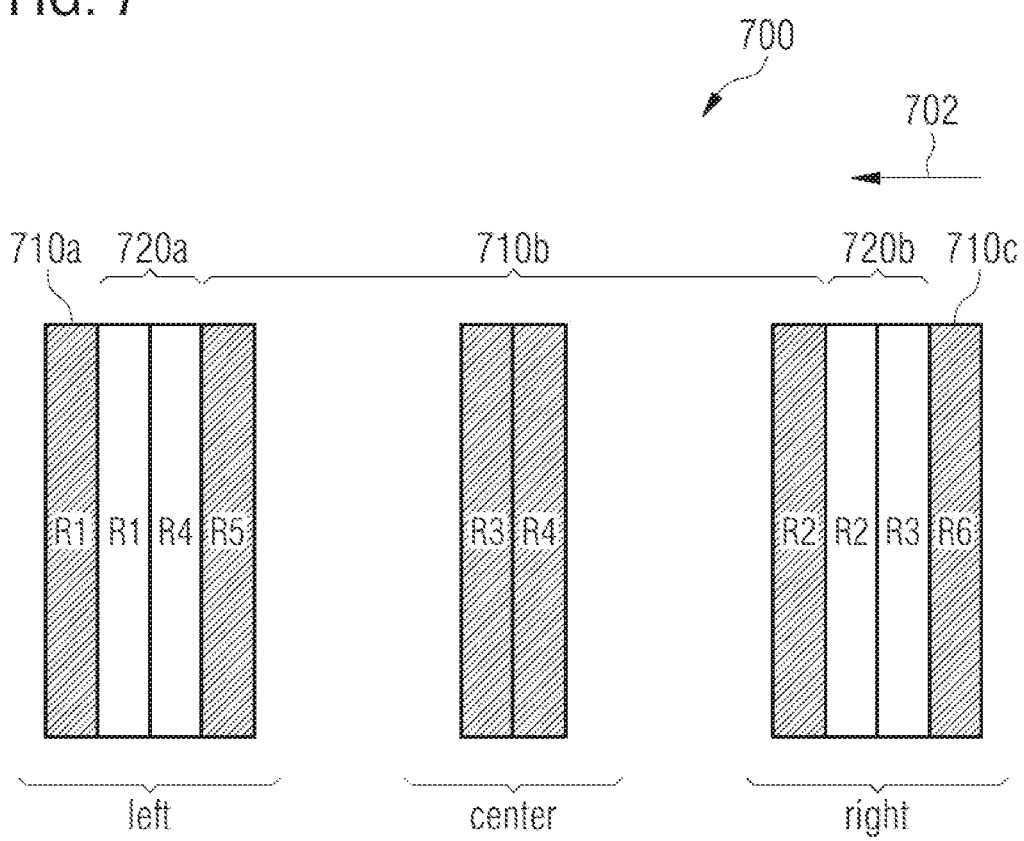
FIG. 7 illustrates a first example for arrangement of the first and second group of sensor elements.

FIG. 7 illustrates another embodiment of a sensor system 700. Similar to the sensor system 600 in FIG. 6, a first portion 720a of a second group of sensor elements 720a-b is arranged between a first portion 710a and a second portion 710b of a first group of sensor elements 710a-c in a predetermined direction 702. In addition to the previous example, a second portion 720b of the second group of sensor elements 720a-b is arranged between the second portion 710b and a third portion 710c of the first group of sensor elements 710a-c in the predetermined direction 702. In the given example, the first portion 720a of the second group of sensor elements 720a-b is arranged directly next to the first portion 710a and the second portion 710b of the first group of sensor elements 710a-c. The second portion 720b of the second group of sensor elements 720a-b is arranged directly next to the second portion 710b and the third portion 710c of the first group of sensor elements 710a-c. As illustrated, the sensor elements of the first portion 720a of the second group, of the second portion 710b of the first group and/or the second portion 720b of the second group can be subdivided into further portions of sensor elements. Further portions referring to the second portion 710b of the first group of sensor elements may be displaced to each other as exemplarily illustrated in FIG. 7. Several (further) portions of sensor elements can be summarized into a left, center and right group depending on the position of the (further) portions relative to each other. An effective pitch of the sensor system 700 may be defined as the distance between the left and right sensor elements. For example, the effective pitch of the sensor system 700 is about 1.6-1.7 mm.

The sensor systems 500, 600 given in FIG. 5 and FIG. 6 may provide a first and second signal having nominally the same or a similar amplitude. In contrast to the sensor system 700 in FIG. 7, the ratio between the amplitudes of the first and second signal may be wheel pitch dependent.

Generally, sensor elements, (further) portions of sensor elements or groups of sensor elements can be arranged arbitrarily such as next to each other, close to each other, directly to each other, parallel to each other, perpendicular to each other, above each other, symmetrically, asymmetrically, with further displacement to each other, with no displacement to each other etc. Sensor elements can be arranged according to two or more directions such that the sensor elements can sense the magnetic field in the same predetermined direction or axis (same magnetic component). For example, sensor elements of a main group are arranged next to each other referring to a x-direction and sensor elements of a subgroup are arranged above the sensor elements of the main group referring to a y-direction. For this implementation, all sensor elements may be able to sense a magnetic field, e.g., in the x-direction.

Generally, sensor element arrangements of described sensor systems may refer to a sensor element configurations typical of speed sensors sensitive to a same direction of a magnetic field. For example and with reference to FIG. 7, sensor elements of the first group 710a-c are bridge resistors for determining a speed and sensor elements of the second group 720a-b are bridge resistors for determining a direction of an object, e.g., an encoder.

Sensor elements can be arranged in circuits such that two signals with a relative phase difference, e.g., sine and cosine, can be provided.

Figure 8:
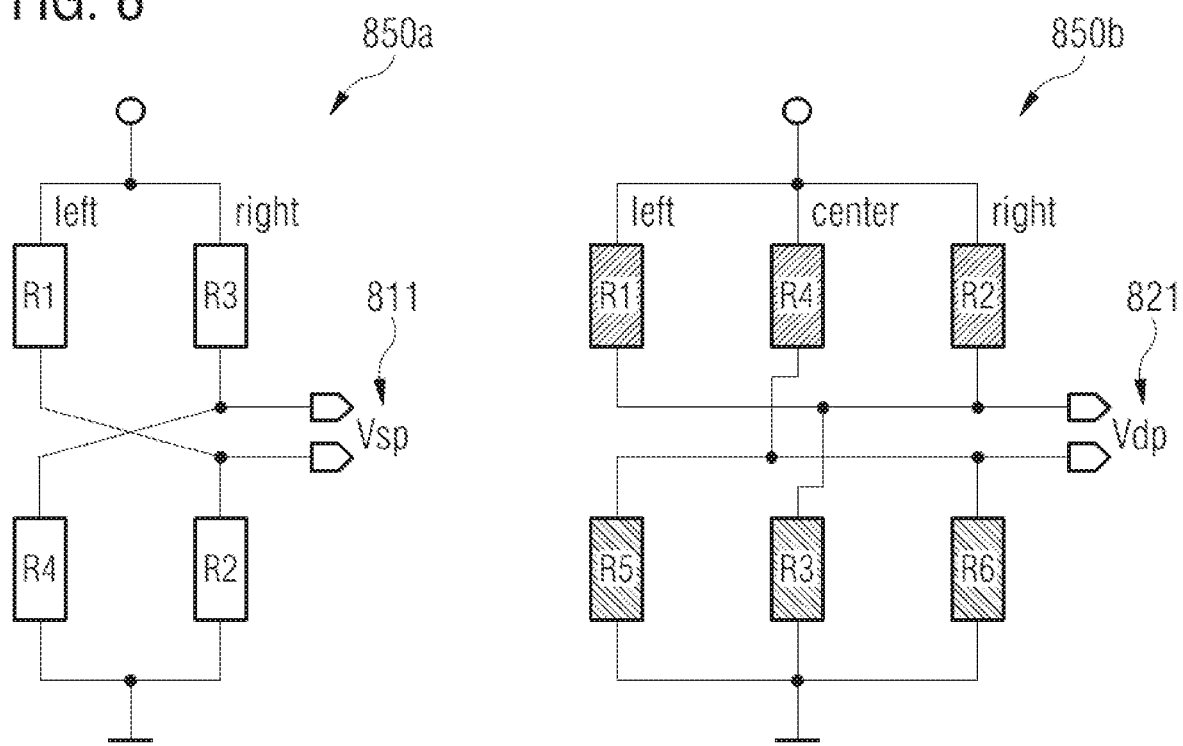
FIG. 8 illustrates an example for a bridge circuit supplying the first signal and an example for a bridge circuit supplying the second signal.

For better understanding, a topology of circuits based on the sensor elements of FIG. 7 is discussed according to an example and with reference to FIG. 8.

In FIG. 8, the first group of sensor elements are arranged in a bridge circuit 850a supplying a first signal 811 and the second group of sensor elements are arranged in a bridge circuit 850b supplying the second signal 821. The bridge circuit 850a comprises the bridge resistors R1-R4 of the first group of sensor elements (referring to 710a-b in FIG. 7). According to the example, the first signal 811 is based on the differential signal of R3 and R4 and the differential signal of R1 and R2. The bridge circuit 850b comprises the bridge resistors R1-R6 of the second group of sensor elements (referring to 720a-c in FIG. 7). According to the example, the second signal 821 is based on the differential signal of R1, R2 and R3 and the differential signal of R4, R5 and R6. For example, usage of bridge arrangements and differential signals for providing the first and second signal may be beneficial to be robust against lifetime, to amplify sensor signals, to reduce temperature drifts, to provide noise cancellation or to compensate external disturbances like homogenous stray fields.

According to an example, the sensor elements are magneto-resistive sensor elements such as anisotropic magnetoresistance (AMR), giant magnetoresistance (GMR) or tunnel magnetoresistance (TMR) sensor elements. The magneto resistive (e.g., GMR or TMR) sensor elements may comprise a pinned layer. The orientation of the pinned layers of the sensor elements may determine the sensitivity of the sensor system regarding the magnetic field sensed in the predetermined direction.

According to an example, the magneto-resistive sensor elements of the first group and the second group comprise pinned layers, wherein the pinned layers of all magneto-resistive sensor elements are parallel or antiparallel to each other. For example, pinned layers of all magneto-resistive sensor elements have at least a sufficient parallel orientation or antiparallel orientation to each other or sensor elements are magnetized in the same or opposite direction. By this means, the sensor elements can be sensitive to the same magnetic field component.

Both parallel and antiparallel orientation of pinned layers of sensor elements may be beneficial for amplifying signals. For example, a sensor system comprising parallel and an antiparallel sensor elements in a half-bridge circuit arrangement is considered. For a given magnetic field, the resistance of one sensor element increases and the resistance of the other (antiparallel) sensor element decreases regarding the sensitive direction. If the magnetic field is reversed in direction, the resistance of the parallel denoted sensor element decreases and the resistance of the other (antiparallel) sensor element increases. Hence, the opposite magnetic field would generate an opposite sign. Thus, a signal using signals comprising opposite signs can be amplified by means of a differential signal. Hence, parallel and antiparallel configuration may increase a sensitivity of the sensor system.

Generally, sensor systems may comprise sensors elements arranged according to another bridge circuit such as in a Wheatstone bridge or in a half-bridge. If appropriate, sensor elements may be arranged in an arbitrary circuit different from a bridge circuit. For example, signals of the sensor elements may be used to generate other signals than differential signals, e.g., by summation or multiplication of sensor signals. According to another example, calculations may be based on digitalized sensor signals. Sensor signals can be directly used or can be further processed to generate the first signal and the second signal for determining an (angular) position.

According to another example and if appropriate, other sensor elements such as Hall-elements sensitive to a same direction can be used for the sensor system.

In the following, the sensor system is considered in combination with an encoder.

Figure 9:
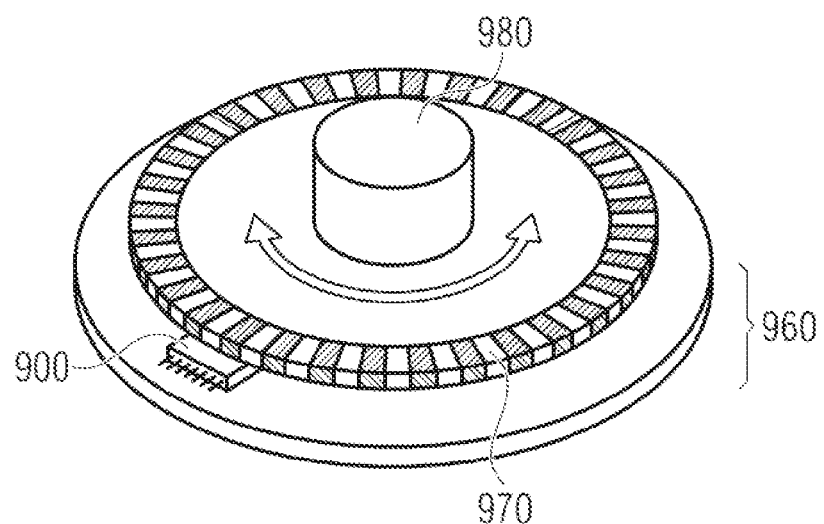
FIG. 9 illustrates an embodiment of a system for determining a position or a rotational angle.
Figure 10A:
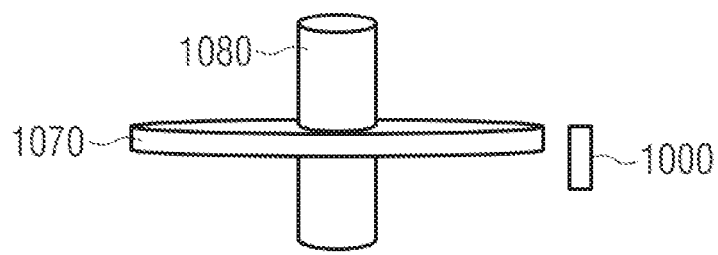
FIGS. 10A-10D illustrate examples for arranging a sensor system with respect to an encoder.
Figure 10B:
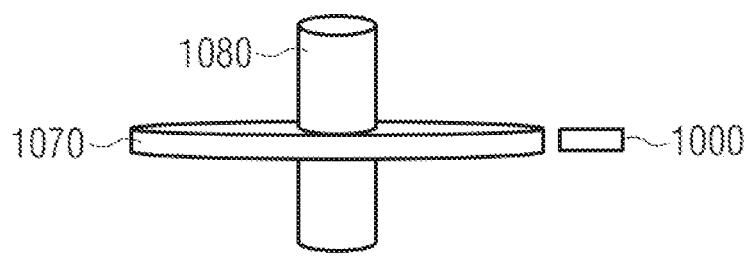
Figure 10C:
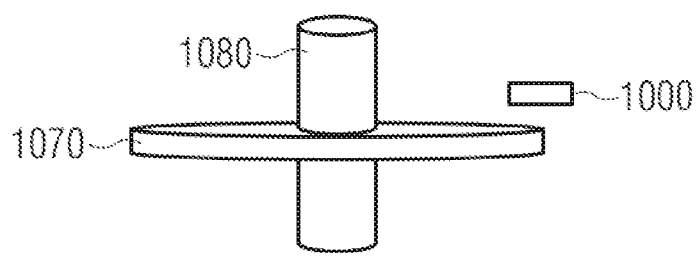
Figure 10D:
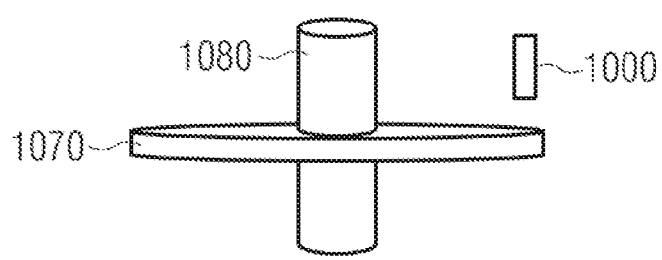

FIG. 9 illustrates a system 960 for determining a position or a rotational angle of a shaft 980. The system 960 comprises a sensor system 900, e.g., according to one of the examples described above. The system 960 further comprises an encoder 970 configured to provide a magnetic field periodically alternating in a predetermined direction. According to FIG. 9, the encoder 970 is connected to the shaft 980 and the sensor system 900 is an integrated circuit (IC) arranged out-of-shaft under the encoder 970. By means of the sensor system 900 and the encoder 970 a (angular) position of the shaft can be determined with high-resolution.

Determination of high resolution angular positions may be enabled by the encoder 970 providing a characteristic alternating magnetic field.

According to FIG. 9. the encoder comprises magnetized materials with periodically alternating poles in the predetermined (rotating) direction. The encoder is an encoder wheel having segments of the magnetized material on its outer circumference. FIG. 9 shows a 360-degree automotive grade rotary angle sensing IC. The IC may be used to measure the angular position of the rotating (motor) shaft in an underneath environment. The position measurement may take place offset from the axis of rotation of the shaft. The encoder (or any magnetic target) for the IC may be mounted and fixed to the shaft.

According to another example, the encoder is an encoder wheel having toothed segments on its outer circumference or segments of cavities within the encoder. For example, the encoder wheel with toothed segments is a metal influencing an external magnetic field of, e.g., a ferromagnet connected to the sensor system or the system. The rotating encoder wheel may change the strength and/or orientation of the external magnetic field with respect to the position or orientation of the toothed segments or cavities of the encoder.

The sensor system can be used in combination with ferrite pole wheels, as for, e.g., TMR based sensor elements strong magnetic fields might not be needed. The TMR sensor elements may work in the linear range rather than in the saturation region. From a sensor point of view, costs may be saved, e.g., due to an easier process or as all sensor elements may be magnetized in the same direction (e.g., for TMR sensor elements). From a system point of view, costs may be saved as, e.g., no rare-earth magnets are required and (sensing) components of the (sensor) system can be placed easily.

As described above, the first group of sensor elements and the second group of sensor elements can be arranged according to a pitch between the segments. For example, the distance between the first group and second group of sensor elements is approximately equal or similar to the distance between adjacent segments of the encoder. According to another example, the distance between the first and second group of sensor elements are similar to the distance defined by a multiple of the distance between adjacent segments. Generally, the relation of a distance between two (groups of) sensor elements and the pitch of segments of an encoder can be in such a way that the first signal and the second signal may have a least relative phase difference, a least signal quality, a least amplitude or another predetermined signal characteristic beneficial to determine the (angular) position of the encoder. Accordingly, the (angular) position of the shaft can be determined, e.g., by means of a calibration if necessary.

FIGS. 10A-10D illustrate further examples for arranging a sensor system 1000 with respect to an encoder 1070 connected to a shaft 1080. The sensor system 1000 can be arranged flexibility such that the magnetic field of the encoder can be sensed appropriately in the predetermined (rotating) direction. As the sensor system 1000 is based on sensing the magnetic field in one direction, the sensor system 1000 can be arranged, e.g., above the encoder (FIGS. 10C and 10D) or below the encoder unless the sensor system may be able to sense the alternating magnetic field sufficiently in the predetermined (e.g., rotating) direction. According to FIGS. 10A and 10B, the sensor system 1000 may be arranged next to the encoder unless the sensor system 1000 may be able to sense the alternating magnetic field sufficiently in the predetermined (e.g., rotating) direction.

Generally, the sensor system may be used in combination with an arbitrary object such as a different type of encoder as described above or any other object providing a characteristic, alternating, magnetic field in a predetermined direction. For example, a rotating object, e.g., a magnet may generate an alternating magnetic field or a rotating object, e.g., a metal may influence an external magnetic field.

Alternatively, the sensor system or the system may be used in a linear moving configuration. For example, the object is an encoder comprising magnetic segments along a predetermined direction, e.g., an x-axis. A sensor system may sense a periodically alternating magnetic fields if the encoder moves along the x-axis. The sensor system may generate the first and second signal to determine, e.g., the position, direction, or a speed of the encoder.

FIG. 11 illustrates a flow chart of an embodiment of a method 1100 for determining a position or a rotational angle. The method comprises supplying 1101 a first signal indicative of a magnetic field in a predetermined direction by means of a first group of sensor elements sensitive to a magnetic field in a predetermined direction. Further, the method 1100 comprises supplying 1102 a second signal having a relative phase shift relative to the first signal by means of a second group of sensor elements sensitive to the magnetic field in the predetermined direction, wherein a combination of the first signal and the second signal indicates the rotational angle of an object.

The method may allow a provision of a suitable first signal and a suitable second signal each indicating a magnetic field the same predetermined direction. For example, the method may supply the first and second signal based on sensor signals of a conventional (e.g., speed) sensor sensitive in the predetermined direction. The method may enable to determine a position or a rotational angle of an object, e.g., by providing an output protocol typical of conventional (e.g., angular) sensors.

The sensor system, the system and the method can be used in any application using alternating magnetic fields for determining an angle, position, speed, direction or orientation of an object. Concepts of the sensor system could be used in any application comprising a rotating shaft and requiring a measurement of the angular movement.

For example, the described concept could be applied in advanced automotive systems, e.g., requiring a high angular resolution such as advanced EPS systems, advanced ABS systems for autonomous driving, asynchronous electric engine control or others. The described concept might not be at system level but may interact with a customer system. The sensor system may be connected to a ECU.

Some other examples may relate to a chip architecture or generally a combination of concepts of angle sensors (e.g. output protocol of angle sensors) and speed sensors (e.g. sensor element configuration), enabling out-of-shaft high resolution angle sensing in combination with multi-poles magnetic encoder wheels.

For example, implementation can be performed according to sensor element configurations exemplarily described above or according to any other sensor element configurations allowing a systematic phase shift between the first and second signals. If suitable, sensor element configurations of speed sensors can be used. In contrast to other angle sensors, sensor elements of the sensor system are sensitive in the same direction or along the same axis, e.g., x-direction. In contrast to speed sensors, the (sensor) system may enable to determine a rotational angle and may generate a typical angle sensor output protocol (with higher-resolution compared to a speed sensor output protocol).

For example, optional or additional analog/digital processing may take place as usually done in angle sensors.

For example, data coming from speed sensors products based on xMR sensors could be used. TMR technology characterization results may also be used to evaluate the linearity, resolution, error of the (sensor) system.

For example, concepts of the (sensor) system may be detected via reverse engineering.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A sensor system, comprising:
    a first group of sensor elements supplying a first signal indicative of a magnetic field in a first predetermined direction; and
    a second group of sensor elements supplying a second signal having a phase shift relative to the first signal, wherein:
        the first group of sensor elements and the second group of sensor elements are arranged in a linear fashion,
        a first portion of the second group of sensor elements is arranged between a first portion and a second portion of the first group of sensor elements in a predetermined displacement direction, and
        a second portion of the second group of sensor elements is arranged outside of the first portion and the second portion of the first group of sensor elements in the predetermined displacement direction, and
    wherein each of the first group of sensor elements and the second group of sensor elements is sensitive to the magnetic field in a same second predetermined direction, and
    wherein a combination of the first signal and the second signal indicates a rotational angle of an object.

2. The sensor system according to claim 1, further comprising:
    evaluation circuitry configured to use the first signal and the second signal to determine a position or the rotational angle of the object.

3. The sensor system according to claim 2, wherein:
the first group of sensor elements, the second group of sensor elements, and the evaluation circuitry are implemented on a same die.

4. The sensor system according to claim 2, wherein:
the evaluation circuitry is further configured to generate an output protocol signal indicating the rotational angle based on the first signal and the second signal.

5. The sensor system according to claim 1, wherein:
the first group of sensor elements are arranged in a first bridge circuit configured to supply the first signal and the second group of sensor elements are arranged in a second bridge circuit configured to supply the second signal.

6. The sensor system according to claim 1, wherein:
the first group of sensor elements is displaced from the second group of sensor elements.

7. The sensor system according to claim 1, wherein:
the second portion of the second group of sensor elements is arranged between the second portion and a third portion of the first group of sensor elements, the first portion and third portion of the first group of sensor elements being on opposite sides of the second portion of the first group of sensor elements.

8. The sensor system according to claim 1, wherein:
the first group of sensor elements and the second group of sensor elements are magneto-resistive sensor elements.

9. A system for determining a position or a rotational angle of an object, comprising:
a first group of sensor elements supplying a first signal indicative of a magnetic field in a first predetermined direction;
a second group of sensor elements supplying a second signal having a phase shift relative to the first signal, wherein:
the first group of sensor elements and the second group of sensor elements are arranged in a predetermined displacement direction,
a first portion of the first group of sensor elements and a second portion of the second group of sensor elements are displaced from each other in the predetermined displacement direction, and
a second portion of the first group of sensor elements and a first portion of the second group of sensors are arranged directly next to each other,
wherein each of the first group of sensor elements and the second group of sensor elements is sensitive to the magnetic field in a same second predetermined direction, and
wherein a combination of the first signal and the second signal indicates the rotational angle of the object; and
an encoder configured to provide a magnetic field that periodically alternates in the first predetermined direction.

10. The system according to claim 9, wherein:
the encoder is an encoder wheel having segments of magnetized material arranged on its outer circumference.

11. The system according to claim 10, wherein:
the first group of sensor elements and the second group of sensor elements are arranged according to a pitch between the segments.

12. The system according to claim 9, wherein:
the encoder is an encoder wheel having toothed segments arranged on its outer circumference or segments of cavities within the encoder.

13. The system according to claim 9, wherein the magnetic field periodically alternates poles in the first predetermined direction.

14. The system according to claim 9, wherein the encoder is an encoder wheel, and wherein the first group of sensor elements and the second group of sensor elements are arranged linearly and parallel to a tangent of the encoder wheel.

15. A method for determining a position or a rotational angle, comprising:
supplying a first signal indicative of a magnetic field in a first predetermined direction via a first group of sensor elements; and
supplying a second signal having a phase shift relative to the first signal via a second group of sensor elements, wherein:
the first group of sensor elements and the second group of sensor elements are arranged in a linear fashion,
a first portion of the second group of sensor elements is arranged between a first portion and a second portion of the first group of sensor elements in a predetermined displacement direction, and
a second portion of the second group of sensor elements is arranged outside of the first portion and the second portion of the first group of sensor elements in the predetermined displacement direction,
wherein each of the first group of sensor elements and the second group of sensor elements is sensitive to the magnetic field in a same second predetermined direction, and
wherein a combination of the first signal and the second signal indicates the rotational angle of an object.

16. The method according to claim 15, further comprising:
determining the position or the rotational angle of the object using the first signal and the second signal.

17. The method according to claim 15, further comprising:
generating an output protocol signal indicating the rotational angle based on the first signal and the second signal.

18. The method according to claim 15, wherein:
the first group of sensor elements and the second group of sensor elements are magneto-resistive sensor elements.

19. The method according to claim 18, wherein:
the magneto-resistive sensor elements of the first group and the second group comprise pinned layers, wherein the pinned layers of all magneto-resistive sensor elements are parallel or antiparallel to each other.

20. The method of claim 15, further comprising:
determining, based on the first signal and the second signal, a position or the rotational angle of the object.

* * * * *